United States Patent
Tachibana et al.

(10) Patent No.: US 8,110,291 B2
(45) Date of Patent: Feb. 7, 2012

(54) COMPOSITE MATERIAL FOR ELECTRIC/ELECTRONIC PART, PRODUCTION METHOD THEREOF, AND ELECTRIC/ELECTRONIC PART

(75) Inventors: Akira Tachibana, Tokyo (JP); Chikahito Sugahara, Tokyo (JP); Shuichi Kitagawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/977,136

(22) Filed: Dec. 23, 2010

(65) Prior Publication Data

US 2011/0091738 A1    Apr. 21, 2011

Related U.S. Application Data

(63) Continuation of application No. PCT/JP2009/061431, filed on Jun. 23, 2009.

(30) Foreign Application Priority Data

Jun. 24, 2008   (JP) .................................. 2008-165138

(51) Int. Cl.
*H05K 9/00* (2006.01)
(52) U.S. Cl. ........ 428/458; 428/209; 428/459; 428/577; 428/626
(58) Field of Classification Search .................. 428/209, 428/901, 458, 459, 577, 626
See application file for complete search history.

(56) References Cited

U.S. PATENT DOCUMENTS

| | | | | |
|---|---|---|---|---|
| 3,693,251 A | * | 9/1972 | Jaccodine | 29/842 |
| 6,333,139 B1 | * | 12/2001 | Omote et al. | 430/311 |
| 2005/0281994 A1 | * | 12/2005 | Tani et al. | 428/209 |

FOREIGN PATENT DOCUMENTS

| | | |
|---|---|---|
| JP | 64-6389 A | 1/1989 |
| JP | 5-245432 A | 9/1993 |
| JP | 2802402 B2 | 9/1998 |
| JP | 2001-105530 A | 4/2001 |
| JP | 2004-197224 A | 7/2004 |
| JP | 2005-117058 A | 4/2005 |
| JP | 2006-86513 A | 3/2006 |
| JP | 2006-281517 A | 10/2006 |

OTHER PUBLICATIONS

International Search Report, dated Aug. 18, 2009, issued in PCT/JP2009/061431.

* cited by examiner

*Primary Examiner* — Cathy Lam
(74) *Attorney, Agent, or Firm* — Birch, Stewart, Kolasch & Birch, LLP

(57) ABSTRACT

A composite material for an electric/electronic part, having a metal base, a resin film on at least a part of the metal base, and a layer of Sn or a Sn alloy on at least a part of the metal base at a site where the resin film is not provided, the layer of Sn or a Sn alloy including a solidified structure, and the resin film having a residual solvent quantity adjusted to 5% to 25% by mass.

15 Claims, 3 Drawing Sheets

COMPOSITE MATERIAL FOR ELECTRIC/ELECTRONIC PART, PRODUCTION METHOD THEREOF, AND ELECTRIC/ELECTRONIC PART

CROSS REFERENCE TO RELATED APPLICATIONS

This application is a Continuation of PCT International Application No. PCT/JP2009/061431 filed on Jun. 23, 2009, which claims the benefit of Patent Application No. 2008-165138 filed in Japan, on Jun. 24, 2008. The entire contents of all of the above applications are hereby incorporated by reference into the present application.

TECHNICAL FIELD

The present invention relates to a composite material for an electric/electronic part having a resin film on a metal base. More particularly, the present invention relates to a composite material for an electric/electronic part having a resin film and a re-melted and solidified plating layer, on a metal base, an electric/electronic part using the composite material, and a method for producing the composite material.

BACKGROUND ART

On a printed circuit board of an electric/electronic device, separate elements, such as a ceramic oscillator, a crystal oscillator, a voltage controlled oscillator, a SAW filter, a diplexer, a coupler, a balun, an LPF, a BPF, and a dielectric duplexer; various modules each having a plurality of such elements integrated therein, such as an antenna switch module, a front end module, an RF integrated module, a radio communication module, an image sensor module, a tuner module, and a wireless LAN module; and parts such as a detection switch are mounted. These are used inside a metal case or covered with a cover, for electromagnetic shielding. In addition to this, as more electric/electronic devices become portable, the case is required to be thinner and smaller and its height is 5 mm for modules, and less than 2 mm or around 1 mm for separate elements.

A terminal connector at the printed circuit board side such as a mother board, a keyboard, or an LCD (Liquid Crystal Display) driver, and a connector at the side of an FPC cable require electromagnetic shielding property for the purpose of preventing communication noises and static electricity; and these are used as covered with a conductive metal case, cap, or cover. Similar to the above case, as devices become smaller and thinner, the connectors and sockets are made smaller and thinner.

However, in the case of the above-mentioned metal cases and the like, reduction of height is accompanied by reduction of internal volume; and there is a problem that insulation between the inner parts, terminals or wiring circuits and the electric/electronic part such as case, cover, cap or package (cover case) is not sufficiently assured.

For such instances, in the conventional art, an insulation film is cut into a sheet of predetermined dimensions and inserted into the case (see, for example, Patent Literature 1), or a metal material having a resin film formed on a metal base in advance is cut into predetermined dimensions (see, for example, Patent Literature 2). Use of a material having a resin film formed on a metal material in advance is preferable in view of economy or productivity as punching or bending working can be performed continuously. Besides, the material is such that it can be coated continuously and with high quality at a part, entire surface or double surfaces thereof as desired. Thus, recently, such materials tend to be used popularly.

With the advance of miniaturizing and sophistication of digital devices and portable devices, many restrictions are imposed on the shape of electric/electronic parts to be mounted thereon. Therefore, working into a desired shape becomes severe, and adhesion in various working process needs to be enhanced. As methods of enhancing adhesion between the metal base and resin film, the following methods can be mentioned, for example, a method wherein the metal base is coated at the surface with a coupling agent (see, for example, Patent Literature 3) and a method wherein a plated layer having a dendrite crystal is formed on a surface of the metal base (see, for example, Patent literature 4).

In addition, in forming a composite material of a metal base and a resin film, there are methods for preventing occurrence of curling in the manufacturing process; they are: a method, when coating a heat resistant resin solution continuously on a metal foil and drying the metal foil to be a flexible metal laminated material, rolling up the material with a predetermined amount or more of solvent left thereon, and subjecting the material to heat treatment while controlling solvent removal and crosslinking reaction of the resin, thereby to manufacture the flexible metal laminated material (see Patent Literature 5) or a method of producing a metal laminated plate having one or more polyimide-series resin layers and a metal conductor, in which the first polyimide-series resin layer in contact with the conductor is mainly composed of aromatic polybasic acid, its acid anhydride, diamine, and diisocyanate, and the residual solvent quantity in the first polyimide resin layer is 20 to 30% by mass (see, for example, Patent Literature 6).

Furthermore, it has been suggested to secure sufficient insulating property with an embedded connector itself by providing a resin film at a site on a metal base where insulation is needed, and, in order to secure sufficient heat-resistant mounting property by solder bonding, it has been suggested to prevent the occurrence of whiskers by forming an Sn-based plating layer having excellent solder wettability on the surface of the areas other than the resin film is formed, and allowing re-melting and solidifying (reflow) by a reflow treatment (see, for example, Patent Literature 7).

Here, when a composite material having an insulating film on a metal base is used as a material for the electric/electronic part, such a material is worked in the following manner. For example, as this material has an insulating film on the metal base, the material is subjected to working such as punching at a part containing a boundary face between the metal base and the insulating film, to form a connector contact or the like. This feature allows arranging such connector contacts at a narrow pitch, and various applications are possible. In addition, after working such as punching, the material may further be subjected to bending working thereby to be applicable to electric/electronic parts having various functions.

When this composite material is subjected to working such as punching at a part including a boundary face between the metal base and the insulating film, a small gap of several μm or several tens μm is sometimes formed at the worked part between the metal base and the insulating film. It is assumed that this gap is formed by insufficient adhesion between the metal base and the resin film. This state is schematically illustrated in FIG. 8. In FIG. 8, 10 denotes a electric/electronic part, 11 denotes a metal base, 12 denotes an insulating film, and a gap 13 is formed between the metal base 11 and the insulating film 12 in the vicinity of a punched surface 11a of the metal base 11. This tendency becomes strong as the clearance in punching becomes larger (for example, 5% or more relative to the thickness of the metal base). As there is a practical limitation for reducing of the clearance in punching, it can be said that this tendency becomes increased as the above-mentioned worked piece is more miniaturized.

In such a state, due to secular changes in punched portion or the like, the insulating film 12 becomes completely peeled off from the metal base 11, and provision of the insulating film 12 on the metal base 11 becomes meaningless. Besides, providing of the insulating film after fine working needs much time and effort and brings about cost increases, which is not practical. Further, if a metal exposed surface of the electric/electronic part formed (for example, punched surface 11a) is to be used as a connector contact or the like, a metal layer may be later formed on the metal exposed surface (for example, punched surface 11a) by plating. However, when such a part is immersed in a plating liquid, the plating liquid may infiltrate via the gap 13 and promote peeling off of the insulating film 12 from the metal base 11.

Besides, when bending is performed after punching, even if no gap is formed between the metal base and the insulating film at a worked part in the process of punching or the like, a gap is sometimes formed between the metal base and the insulating film after bending is performed. This is schematically illustrated in FIG. 9. In FIG. 9, 20 denotes an electric/electronic part, 21 denotes a metal base, 22 denotes an insulating film, and a gap 23 is formed at an inner side of a bent part of the metal base 21 and a gap 23, 24 is formed at an end (particularly at an outer side of the bent part) of the electric/electronic part 20. As illustrated in FIG. 9, these gaps 23 and 24 are prominently formed at the inner surface side and side surface of the bent part of the bent electric/electronic part and at the end of the electric/electronic part, and they may cause peeling off of the insulating film 22 from the metal base 21.

Patent Literature 1: JP-A-1-6389 ("JP-A" means unexamined published Japanese patent application)
Patent Literature 2: JP-A-2004-197224
Patent Literature 3: Japanese Patent No. 2802402
Patent Literature 4: JP-A-5-245432
Patent Literature 5: JP-A-2001-105530
Patent Literature 6: JP-A-2005-117058
Patent Literature 7: JP-A-2006-86513

SUMMARY OF INVENTION

Technical Problem

However, even if the technologies for composite materials for electric/electronic part having an organic film on a metal base as described in the various patent literatures are combined, the adhesion between the metal base and the resin film is decreased when precision press working, high temperature processing, plating processing or the like is carried out during the production of electric/electronic parts that are to be mounted and used in mobile devices or digital devices. Thus, a sufficiently satisfactory composite material has not yet been obtained.

The techniques disclosed in Patent Literatures 1 and 2 are not designed with a consideration of post treatment such as plating, high-temperature treatment or precision press working in manufacturing of the electric/electronic part; and these literatures do not describe enhancement of adhesion between the metal base and the resin film in the electric/electronic part to such a degree that they can resist the post treatment. Furthermore, the adhesion after post-treatments cannot be said satisfactory.

In the method of coating a coupling agent as disclosed in Patent Literature 3, because the liquid life duration of the coupling agent is short, there is a need to pay due attention to management of the liquid. In addition, as it is difficult to perform treatment uniformly on the entire surface of the metal base, this method can not be effective for the above-mentioned small gap.

In the method of forming a plated layer having dendrite crystal disclosed in Patent Literature 4, because plating needs to be performed on the restricted plating conditions to control a crystal state of the formed plated layer, there is a need to pay due attention to management. Further, in order to assure sufficient adhesion, the plating thickness needs to be 1 μm or more, which causes problems of cracking in the plated layer in punching and economically unfavorable.

Further, the techniques disclosed in Patent Literatures 5 and 6 are presented to adjust a residual solvent quantity during manufacturing in order to prevent occurrence of curl in the manufacturing, and are not linked to enhancement of the adhesion between metal base and the resin film. Furthermore, the technology described in Patent Literature 7 is not paying attention to the press workability and the like, and does not provide sufficient workability. Particularly, the working of post-treatments is not satisfactory.

Then, in obtaining a metal resin composite material (hereinafter referred to simply as "composite material") suitable for use in preparing an electric/electronic part that is to be subjected to working, such as a shield case, a connector, a terminal and the like, and in order to solve the above-mentioned problems, the object of the present invention is to provide a metal resin composite material for an electric/electronic part which is extremely excellent in workability by press such as punching or bending by enhancing adhesion between a metal base and a resin film, and can hold high degree of adhesion between the metal base and the resin film even after heat treatment, plating or the like.

Solution to Problem

In view of the above-mentioned problems, the present inventors conducted a thorough investigation. Though it is usual to employ the production method that bring out the best resin property by heating the resin film for a long time and reducing a solvent in the resin film as much as possible; the present inventors found that, when considering adhesion between the metal and the resin, leaving an appropriate amount of the solvent enhances the adhesion between the metal and the resin and improves workability. The inventors found that, in facilitating post-treatments such as soldering by providing a layer of Sn or a Sn alloy on at least a part of a metal base at a site where the resin film is not provided, the adhesion between the metal and the resin is enhanced even without applying any special treatment, by clarifying the relationship between the final residual solvent quantity in the resin film and the adhesion and by leaving behind an appropriate residual solvent quantity, and the workability is also enhanced. Thus, the inventors conducted a further investigation, and thus finally completed the present invention.

According to the present invention, there is provided the following means:

(1) A composite material for an electric/electronic part, having a metal base, a resin film on at least a part of the metal base, and a layer of Sn or a Sn alloy on at least a part of the metal base at a site where the resin film is not provided, the layer of Sn or a Sn alloy including a solidified structure, and the resin film having a residual solvent quantity adjusted to 5% to 25% by mass;

(2) A composite material for an electric/electronic part, having a metal base, a resin film on at least a part of the metal base, and a layer of Sn or a Sn alloy on at least a part of the metal base at a site where the resin film is not provided, the layer of Sn or a Sn alloy including a solidified structure, and the layer of Sn or a Sn alloy being obtained by heating a layer formed by plating and thereby re-melting and solidifying the layer, wherein the resin film prior to the re-melting and solidifying of the plating layer has a residual solvent quantity adjusted to 10% to 30% by mass, and the resin film after the re-melting and solidifying of the plating layer has a residual solvent quantity adjusted to 5% to 25% by mass;

(3) The composite material for an electric/electronic part according to item (1) or (2), wherein the resin film is composed of a polyamide-imide;

(4) The composite material for an electric/electronic part according to any one of items (1) to (3), wherein the metal base is of copper or copper alloy;

(5) The composite material for an electric/electronic part according to any one of items (1) to (4), wherein one or plural metal layers are provided on the metal base, and the resin film is provided on the metal base directly or with at least one of the metal layer interposed between the resin film and the metal base;

(6) A composite material for an electric/electronic part, having: a metal base, a resin film which is obtained by applying a varnish prepared by dissolving a resin or a resin precursor in a solvent, on at least a part of the metal base and reactively curing the resin film by a heating treatment, and a layer of Sn or a Sn alloy provided on at least a part of the metal base at a site where the resin film is not provided, the layer of Sn or a Sn alloy including a solidified structure, and
wherein the composite material is for use that requires press working,
wherein the layer of Sn or a Sn alloy is obtained by forming a layer by plating and then heating the layer thereby re-melting and solidifying the layer, the resin film after the re-melting and solidifying of the layer of Sn or a Sn alloy has the residual solvent quantity adjusted to 5% to 25% by mass, and thereby both the adhesion between the resin film and the metal base at the time of press working, and the press workability are excellent;

(7) A composite material for an electric/electronic part, having: a metal base, a resin film which is obtained by applying a varnish prepared by dissolving a resin or a resin precursor in a solvent, on at least a part of the metal base and reactively curing the resin film by a heating treatment, and a layer of Sn or a Sn alloy provided on at least a part of the metal base at a site where the resin film is not provided, the layer of Sn or a Sn alloy including a solidified structure, and
wherein the composite material is for use that requires press working,
wherein the layer of Sn or a Sn alloy is obtained by forming a layer by plating and heating the layer thereby re-melting and solidifying the layer, the resin film prior to the re-melting and solidifying of the layer of Sn or a Sn alloy has the residual solvent quantity adjusted to 10% to 30% by mass, the resin film after the re-melting and solidifying of the layer of Sn or a Sn alloy has the residual solvent quantity adjusted to 5% to 25% by mass, and thereby both the adhesion between the resin film and the metal base at the time of press working, and the press workability are excellent;

(8) An electric/electronic part using the composite material for an electric/electronic part according to any one of items (1) to (7), having the residual solvent quantity in the resin film adjusted to 5% to 25% by mass; and (9) A method for producing a composite material for an electric/electronic part, comprising:
forming, on at least a part of a metal base, a resin film having a residual solvent quantity of 10% to 30% by mass;
forming a plating layer of Sn or a Sn alloy, on at least a part of the metal base, at a site where the resin film is not provided;
heating the plating layer after the forming of the plating layer, thereby re-melting and solidifying the plating layer to obtain a layer including a solidified structure, and, at the same time, adjusting the residual solvent quantity in the resin film obtained after re-melting and solidifying the plating layer, to a value lower than the residual solvent quantity at the time of the formation of the resin film and 5% to 25% by mass.

Advantageous Effects of Invention

The composite material for an electric/electronic part of the present invention has very excellent adhesion between the resin film and the metal. The composite material has enhanced adhesion, and has satisfactory punchability and bending workability, by press working. Furthermore, when a composite material for an electric/electronic part is produced under the same conditions as in the present invention, there is a significant advantage that since the composite material is softer than the resin itself that has been completely cured, bending workability by press working is also enhanced, and working by pressing is made easier.

Furthermore, since the composite material for an electric/electronic part of the present invention has enhanced and excellent adhesion between the resin film and the metal, the composite material is also excellent in heat resistance, alkali resistance and the like; and since baking of the resin film is carried out in consideration of the post-treatments, the composite material sufficiently withstands a heat treatment or a post-plating treatment, both of which are post-treatments after working, and can be worked under the working conditions that are equivalent to those of an untreated material.

The above-mentioned and other features and advantages of the present invention will be apparent from the following description with reference to the attached drawings when appropriate.

REFERENCE NUMERALS

Figure 1:
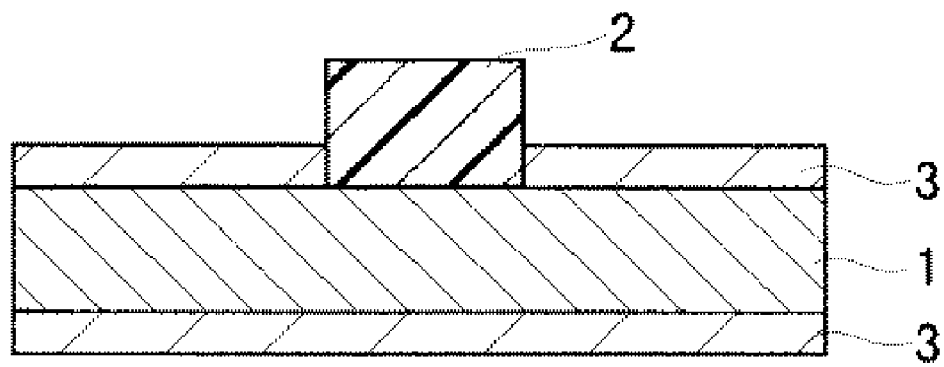
FIG. 1 is an enlarged cross-sectional view illustrating an exemplary composite material for an electric/electronic part according to a first embodiment of the present invention.

| | |
|---|---|
| 1 | Metal base |
| 2 | Resin film |
| 3 | Sn or Sn alloy plating layer |
| 4 | Metal layer |
| 5 | Surface pre-treatment layer |
| 10 | Electric/electronic part |
| 11 | Metal base |
| 11a | Punched surface |
| 12 | Insulating film |
| 13 | Gap |
| 20 | Electric/electronic part |
| 21 | Metal base |
| 22 | Insulating film |
| 23, 24 | Gap |

DESCRIPTION OF EMBODIMENTS

The composite material for an electric/electronic part of the present invention has a resin film formed on at least a part of a metal base, and has a layer of Sn or a Sn alloy on at least a part of the metal base at a site where the resin film is not provided, and the layer of Sn or a Sn alloy includes a solidified structure. This layer is a layer including a solidified structure that is formed as the plating layer of Sn or a Sn alloy is re-melted and solidified. Hereinafter, the "layer of Sn or a Sn alloy" may be expressed as a "plating layer of Sn or a Sn alloy" or simply as a "plating layer" in the descriptions.

The composite material for an electric/electronic part of the present invention is preferably a material that is subjected to, in the course of the production process, a heating treatment (re-melting treatment: reflow treatment) after a plating layer of Sn or a Sn alloy has been provided. When the surface of the layer of Sn or a Sn alloy is smoothened, a surface having glossiness and good appearance may be obtained, and solder mounting can be easily achieved. It has been confirmed that the metal structure of Sn or a Sn alloy after the reflow is enlarged as compared with the metal structure (plating structure) prior to the reflow. According to the present invention, in this metal structure after the reflow treatment, a structure resulting from re-melting and solidification of the plating structure is referred to as "solidified structure."

Furthermore, by conducting the reflow treatment, the stress that is generated during the plating process of Sn or a Sn alloy is relieved, and the occurrence of whiskers is suppressed. When whiskers occur, there is a risk that the whiskers may cause defects such as short circuit; and this cause a problem particularly when the composite material is used for an application where fine working is required. The composite material for an electric/electronic part of the present invention is suppressed with the occurrence of whiskers, and can therefore be used advantageously in the applications where fine working is required.

Here, the term "at least a part of the metal base" in connection with both the resin film and the plating layer may be any amount of area that is sufficient for accomplishing the functions intended by the respective layers, and since the amount of area varies in accordance with the application of the desired composite material, there are no particular limitations. For example, in the case where the shape of the metal base is a metal strip, a metal foil, or a metal plate, when all of the surfaces (6 sides) are considered, the resin film or the plating layer may be formed over the entirety or a part of any one surface, or may be formed over plural surfaces. The resin film or the plating film may also be provided in a stripe form or in a spot form, at desired sites, as will be described later.

Since the composite material of the present invention has the resin film provided at those sites where insulation is required, the function as a composite material is effectively exhibited. For example, when this composite material is fabricated into a casing part such as a shield case, the insulating properties between the casing part and other parts can be maintained satisfactorily, and therefore, it is advantageous for the low profiling of the casing part. When the composite material is fabricated into an electrical connection part such as a connector or a terminal, the insulating properties between the electrical connection part and the adjacent parts can be maintained satisfactorily, and therefore, it is advantageous for the narrowing of the pitch of the connector, or the like.

The present invention defines (1) the residual solvent quantity in the resin film, after application of a resin on a metal base and curing to form the resin film and before the re-melting and solidification of a plating layer (hereinafter, also referred to as the "residual solvent quantity prior to the re-melting and solidification of plating layer"), and (2) the residual solvent quantity in the resin film, after formation of a resin film, subsequent formation of a plating layer on the metal base at a site where the resin film is not provided, and re-melting and solidification of the plating layers (hereinafter, also referred to as the "residual solvent quantity in the resin film after the re-melting and solidification of plating layer").

The residual solvent quantity in the resin film obtained before forming a plating layer and re-melting and solidifying the plating layer, is 35% by mass or less, and preferably 10% to 30% by mass, of the resin film.

Furthermore, when the composite material is obtained by re-melting and solidifying the plating layer, since a heat treatment is applied, the amount of solvent in the resin film is reduced. However, the residual solvent quantity in the obtained resin film is 5% to 25% by mass, and preferably more than 5% by mass and equal to or less than 15% by mass.

Here, the residual solvent quantity is a mass of the solvent remaining in the resin film and can be expressed by the following equation.

Residual solvent quantity (% by mass)=(Residual solvent mass/Resin film mass)×100(%)

If the residual solvent quantity is too small, adhesion between the resin film and metal is reduced. If the residual solvent quantity is too large, adhesion between the resin film and metal is reduced and curing of the resin becomes insufficient so that it becomes difficult to work the material into a part.

The residual solvent quantity can be measured by gas chromatography (GC), Thermo Gravimeter-Differential Thermal Analysis (TG-DTA), Thermo Gravimeter-Differential Scanning calorimeter (TG-DSC) and the like.

A desired residual solvent quantity may be obtained by appropriately determining the conditions such as, for example, the curing temperature and curing time for the resin, or the temperature and time for the melting of plating layer. Then, these conditions are determined to produce a composite material for an electric/electronic part.

In the present invention, the metal base may be made of metal materials of various shapes, among which metal strip, metal foil, and metal plate are used mainly. When the base is too thin, the strength of the material becomes insufficient for working into a part; and when the base is too thick, press punching properties and bending formability are deteriorated. Hence, the base thickness is preferably 0.01 to 1 mm, and more preferably 0.05 to 0.5 mm, though it depends on the use purpose of composite material.

In the present invention, as the metal base, use is made of a material having ductility so that punching, bending, and draw forming are possible or a metal material having spring property. Specifically, examples of the metal base materials include pure copper materials such as oxygen-free copper and tough pitch copper; copper-base alloy materials such as nickel silver (Cu—Ni-series alloy), phosphor bronze (Cu—Sn—P-series alloy), and Corson alloy (Cu—Ni—Si-series alloy); pure iron materials; iron-base alloy materials such as Alloy 42 (Fe—Ni-series alloy) and stainless steel. From the viewpoint of electrical properties or platability, copper or a copper-based alloy is preferred.

In the present invention, the electric characteristic of the metal base is preferably set to an appropriate value depending on the intended use of the composite material. For example, for an electromagnetic shield (shield cases) use, the electrical conductivity is preferably 5% IACS or more, or more preferably 10% IACS or more, in view of the electromagnetic shielding property. The specific permeability is preferably 1 or more.

Further, for connector or terminal uses, the desired electrical conductivity varies depending on whether it is used for signal transmission or power transmission. For signal transmission uses, the electrical conductivity is preferably 15% ICACS or more, in view of securing required electrical conductivity. For power transmission uses, the electrical conductivity is preferably 60% IACS or more, in view of preventing of heat generation.

The metal base can be manufactured, for example, by melting and casting a predetermined metal material into an ingot, and subjecting the ingot to hot rolling, cold rolling, homogenizing treatment, and degreasing, in this order, by the conventional methods.

In the present invention, methods for providing the resin film on the metal base includes (a) a method of arranging a resin film backed with an adhesive agent, on a part on the metal base where insulation is required, melting the adhesive agent with an induction heating roll, and performing a heating treatment to bond them by reaction curing, and (b) a method of coating a varnish containing a resin or resin precursor dissolved in a solvent, on a part on the metal base where insulation is required, volatilizing or not volatilizing the solvent according to need, and then, performing a heating treatment to bond them by reaction curing. Whichever method (a) or (b) is adopted, by adjusting the residual solvent quantity in the resin film or adhesive agent after reaction curing to 10 to 30 mass % (prior to the re-melting and solidification of plating layer) or to 5 to 25 mass % (after the re-melting and solidification of plating layer), high adhesion and excellent workability to solve the above-mentioned problems can be achieved. In consideration of controllability of the residual solvent quantity, the method (b) is more preferable.

In consideration of applications for various parts, the tolerance of the position where the resin film is provided on the metal base is preferably ±0.15 mm, more preferably ±0.10 mm, and much more preferably ±0.05 mm.

In the present invention, the resin for forming the resin film is, for example, a polyimide-series, polyamide-imide-series, polyamide-series, or epoxy-series resin. In the present invention, the resin is preferably a heat-resistant resin, and particularly preferably a polyamide-imide resin, because, after film formation, the resin is subjected to heat treatment such as coating treatment and reflow mounting.

Further, as the insulation property of the resin film, the volume resistivity is preferably $10^{10}$ Ω·cm or more, and more preferably $10^{14}$ Ω·cm or more.

When the metal base is coated on its surface with a varnish containing a resin or resin precursor dissolved in a solvent and is subjected to heat treatment for reaction-curing, the heating temperature is preferably selected from 100 to 500° C., and more preferably from 200 to 400° C., depending on the type of resin used. If the heating temperature is too high, the resin is thermally decomposed after being reaction-cured; and if the heating temperature is too low, it takes much time until the resin is cured and thus the productivity is deteriorated. In consideration of suppressing foaming of the resin film in the heating treatment, the temperature increasing speed of the metal base is preferably 45° C./sec or less, and more preferably 10 to 35° C./sec.

As the solvent, N-methyl-2-pyrrolidone (NMP), xylene, dimethylformamide (DMF), γ-butyl lactone, methyl ethyl ketone (MEK), toluene, methanol, ethanol are used preferably.

The concentration of the resin or resin precursor in the varnish for the coating treatment is preferably 5 to 40% by mass, and more preferably 10 to 30% by mass.

In addition, when the resin film is provided on the metal base with use of an adhesive agent, the adhesive agent may be of polyimide-series, epoxy-series, acrylic-series, or silicone-series resin. These resins have heat resistance against the heating treatment such as solder bonding, reflow solder mounting. For applications where heating conditions are not so severe, a resin of low heat-resistant property (for example, phenol-series, polyamide-series, or polyethylene terephthalate-series resin) may be used instead of the above-mentioned resins.

As to the thickness of the resin film, if the film is too thin, sufficient insulation cannot be assured, and pin holes are easily formed. Therefore, the thickness is preferably 2 μm or more, and more preferably 3 μm or more. Meanwhile, if the film is too thick, press workability such as punching and bending is reduced, and therefore, the thickness is preferably 50 μm or less, and more preferably 30 μm or less. The thickness of the resin film is preferably larger than the thickness of the Sn or Sn alloy plating layer (also referred to as "Sn or Sn alloy layer"). Furthermore, it is preferable that when the composite material is viewed from the lateral side to the thickness direction, the outermost surface of the resin film layer that is parallel to the base surface, be higher than the outermost surface of the Sn or Sn alloy plating layer that is parallel to the base surface.

According to the present invention, the resin film is provided, not over the entire surface but on at least a part of the metal base, and in at least one layer. It is also preferable that the resin film be provided directly on the metal base, or be provided with at least one underlying metal layer (not a Sn or Sn alloy layer) interposed between the metal base and the resin film.

The composite material of the present invention may have the Sn or Sn alloy layer as a single layer or as multiple layers including the underlying metal layer, at a site where the resin film described above is not provided. For example, for applications to be subjected to solder-mounting, the thickness of the Sn or Sn alloy layer at the surface is preferably 1 μm or more so that solder wetting is held well and fusion bonding such as reflow soldering is applicable. The upper limit is around 20 μm, and if the thickness exceeds this value, the effect is saturated. For applications other than solder-mounting applications, in view of corrosion resistance, resin adhesion, and the like, the thickness of the Sn or Sn alloy layer as the outermost layer is preferably 0.1 µm to 10 µm.

Further in regard to the underlying metal layer other than the surface layer, it is preferable to provide one layer having the thickness of from 0.1 µm to 10 µm, from the viewpoint of cost effectiveness; and when the underlying metal layer is composed of multiple layers, the thickness of each of the layers is preferably from 0.1 µm to 10 µm. If the thickness is excessively small, a large number of pinholes may generate, and if the thickness is excessively large, cracks may easily occur during working.

The materials of the underlying metal layer provided on the metal base are determined depending on the material quality of the metal base, the kind of parts to be used, the intended application, required characteristics, allowable cost, and the like. In any case, a metal that meets the basic required characteristics for a final part should be selected. The above-mentioned metal layer is generally of one metal selected from Ni, Cu, Ag, Pd, and Au, or an alloy, eutectoid, or compound containing at least one of the above-mentioned metals.

In view of the cost effectiveness, Ni-based or Cu-based metal is preferably used as an underlying metal layer; and, in the case of forming multi-layer, a Cu-based, Ag-based, or Pd-based metal is preferably used as an intermediate layer.

As the Sn-based plating layer, a non-glossy film is suitable rather than a glossy film, and Sn-based, Sn—Cu-based, Sn—Ag-based, Sn—Bi-based, or Sn—Zn-based film (metal, alloy, eutectoid, compound) is used. As to the materials other than Sn—Bi-based, those having a composition near eutectic, of which the melting point is low, can be used easily.

Particularly, Sn-based, Sn—Cu-based, and Sn—Ag-based alloys are excellent in heat resistance, and thus these alloys are preferably used.

The above-mentioned Sn—Cu-based and Sn—Ag-based films may be provided by forming alloy films, or by forming a Cu layer or Ag thin layer on a Sn film and then alloying them by melting.

The Sn or Sn alloy plating layer is generally provided in a wet process.

The wet process includes immersion plating method, electroless plating method, electrodeposition method, and the like. Out of these, the electrodepositon method is excellent in the points of stability of the bath, thickness controllability, and uniformity of the thickness of plating layer. It also has a merit of inexpensive total cost.

The above-mentioned electrodeposition method uses a commercially available bath or usual plating liquid, and is performed in such a manner that the metal base is used as a cathode, the above-mentioned plating liquid is given at an appropriate relative speed between the cathode and soluble or insoluble anode, and constant current electrodeposition is performed.

In order to provide the plating layer partially, a method of masking the part not to be plated, a method of supplying a plating liquid in spots to a part to be plated, and the like, may be adopted.

As the method of performing the reflow treatment and the re-melting and solidification of the Sn or Sn alloy layer after the formation of a resin film, it is usual to employ a method of exposing the Sn or Sn alloy layer to a heating atmosphere which is determined on the basis of the heating method, temperature, and exposure time. The melting point of the Sn-based film is approximately 200° C.; but, in order to perform the heating and melting continuously in a short period of time, the heating may be carried out at 300° C. or higher, preferably for 0.5 to 10 seconds at 500° C. to 900° C., and more preferably for 0.5 to 5 seconds at 500° C. to 900° C. If the heating temperature is low, it is preferable to perform the treatment in a relatively long time, and if the heating temperature is high, it is preferable to perform the treatment in a relatively short time. Furthermore, the method of performing the reflow treatment and the re-melting and solidification may be carried out by circulation type heating or in a fan-mounted heating furnace, by which heat can be easily transferred to the resin film or the metal base; however use can also be made of a high frequency-induced induction type heating of the metal base, by which deterioration or discoloration of the resin can be easily prevented. Alternatively, circulation type heating or heating by a fan-mounted heating furnace, and high frequency-induced induction heating of the metal base can also be used in combination.

The plating layer and the underlying metal layer may be provided only at a necessary part where, for example, soldering is to be performed, and, at the other parts, the metal base may be exposed. In the composite material of the present invention, the plating layer and the underlying metal layer may be provided only at a necessary part where, for example, soldering is to be performed, and, at the other parts, the metal base may be exposed.

The composite material for an electric/electronic part having the plating layer and the resin film formed on the metal base of the present invention can be used in fabricating any electric/electronic parts. Such parts are not limited specifically and include, for example, connectors, terminals, and shield cases, which may be adopted in electric/electronic devices such as portable phones, portable information terminals, notebook computers, digital cameras, and digital videos.

The following description is made in detail, with reference to the drawings, about preferable embodiments of the composite material for an electric/electronic part of the present invention. However, these embodiments are not intended for limiting the present invention.

For example, the resin film and the Sn or Sn alloy plating layer may be provided on single surface or both surfaces of a metal base, the resin film may comprise multiple layers.

In addition, it is also acceptable to have the metal base exposed at those sites where the resin film, the Sn or Sn alloy plating layer, the metal layer and the like are not provided. There is an advantage that in these sites, the heat emission properties are maintained at a high level.

That is, embodiments of the present invention may be modified appropriately in accordance with required characteristics of the electric/electronic part as a final product.

FIG. 1 is an enlarged cross sectional view of a composite material according to a first embodiment of the present invention.

A resin film 2 is provided at at least one site on a metal base 1 where insulation is required, and a reflow Sn or Sn alloy plating layer 3 is provided on the metal base at a site where the resin film 2 is not provided (here, the term "reflow Sn or Sn alloy plating layer" means a Sn plating layer or Sn alloy plating layer, which has been re-melted and solidified by a reflow treatment).

Figure 2:
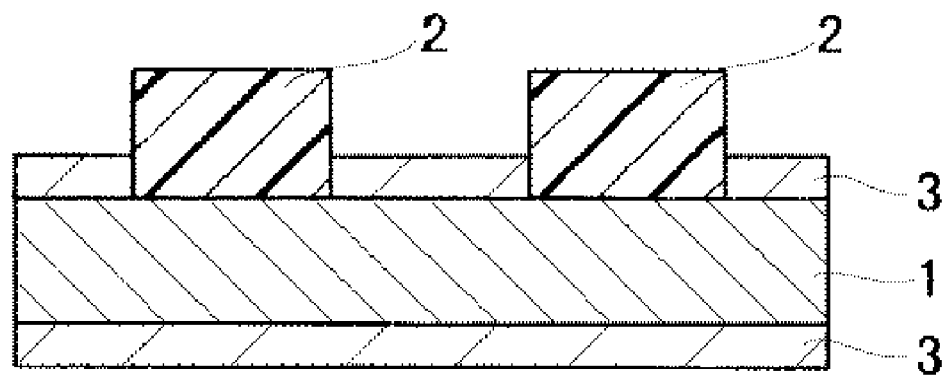
FIG. 2 is an enlarged cross-sectional view illustrating an exemplary composite material for an electric/electronic part according to a second embodiment of the present invention.

FIG. 2 is an enlarged cross sectional view of a composite material according to a second embodiment of the present invention.

A resin film 2 is provided at at least two sites on a metal base 1 where insulation is required, and a reflow Sn or Sn alloy plating layer 3 is provided on the metal base at sites where the resin film 2 is not provided.

The composite materials shown in FIG. 1 and FIG. 2 have a reflow Sn or Sn alloy plating layer 3 on the metal base 1 at those sites other than the sites where the resin film 2 is provided. Furthermore, since the residual solvent quantity in the resin film 2 after the re-melting and solidification of the plating layer 3 is adjusted to 5% to 25% by mass, the adhesion of the resin film 2 to the metal base 1 is excellent, and the composite material is effective in preventing the occurrence of whiskers and also has satisfactory corrosion resistance.

Figure 3:
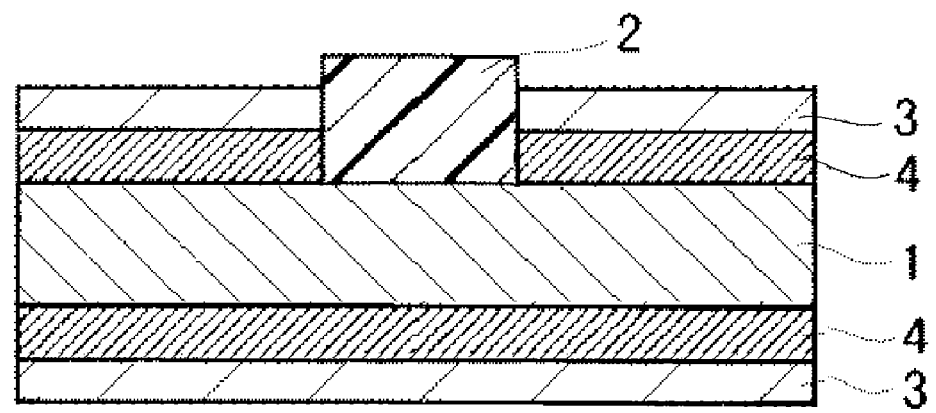
FIG. 3 is an enlarged cross-sectional view illustrating an exemplary composite material for an electric/electronic part according to a third embodiment of the present invention.

FIG. 3 is an enlarged cross sectional view of a composite material according to a third embodiment of the present invention.

The resin film 2 is provided on the metal base 1 at at least one site where insulation is required, and a underlying metal layer 4 and a reflow Sn or Sn alloy plating layer 3 are provided in this order on the metal base 1 at those sites where the resin film 2 is not provided.

Figure 4:
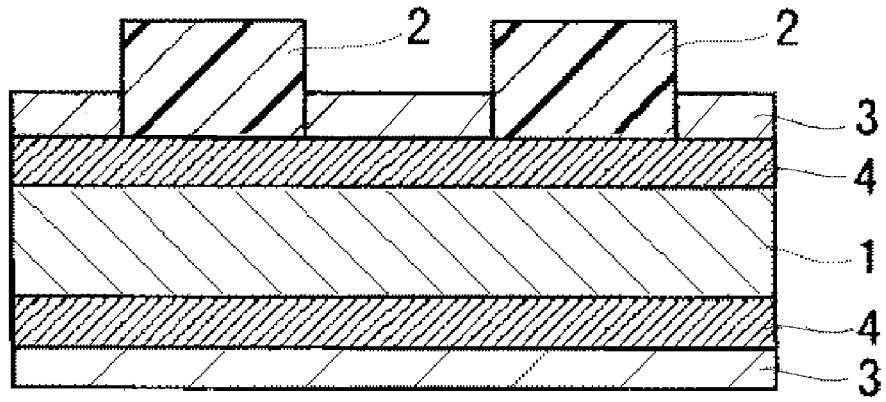
FIG. 4 is an enlarged cross-sectional view illustrating an exemplary composite material for an electric/electronic part according to a fourth embodiment of the present invention.

FIG. 4 is an enlarged cross sectional view of a composite material according to a fourth embodiment of the present invention.

An underlying metal layer 4 is provided on a metal base 1, and a resin film 2 is provided thereon at two sites where insulation is required. A reflow Sn or Sn alloy plating layer 3 is provided on the metal layer 4 at the sites where the resin film 2 is not provided.

The composite materials of the present invention shown in FIG. 3 and FIG. 4 are adjusted so that the residual solvent quantity in the resin film 2 after the re-melting and solidification of the plating layer 3 is 5% to 25% by mass, and at the same time, the plating layer 3 is provided on the metal base 1 at a site where the resin film 2 is not provided. Therefore, the composite materials can maintain the adhesion of the resin film 2 to the metal base 1 at a high level, and solder bonding, reflow solder mounting and the like can be easily carried out. As the composite materials for use in the applications where reflow solder mounting is to be carried out, it is allowable to use materials, for example, satisfying the following condition (1) or (2): (1) the residual solvent quantity in the resin film 2 obtained in a state before the Sn or Sn alloy plating layer 3 is re-melted and solidified (reflow) is adjusted to 10% to 30% by mass, and (2) the residual solvent quantity in the resin film 2 obtained in a state after the Sn or Sn alloy plating layer 3 is re-melted and solidified (reflow) is adjusted to 10% to 30% by mass (so that the residual solvent quantity in the resin film after reflow solder mounting would be 5% to 25% by mass).

Furthermore, by providing a metal layer 4 in between the metal base 1 and the reflow Sn or Sn alloy plating layer 3 as the surface layer as shown in FIG. 3 and FIG. 4, the metal base 1 is well protected, and the heat resistance, oxidation resistance, corrosion resistance and the like of the metal base are enhanced. Further, since the diffusion of the components of the metal base 1 is inhibited by the metal layer 4, formation of an alloy or compound between the plating layer 3 and the components of the metal base 1 can be suppressed, and discoloration of the plating layer 3 can be prevented. In addition to these, since the composite material shown in FIG. 4 has the resin film 2 provided on the metal layer 4, an effect of enhancing the adhesion to the resin film 2 is obtained.

In particular, when a Ni layer or a Cu layer is provided as an underlying metal layer 4, the formation of an alloy or compound between the plating layer 3 and the components of the metal base 1 is sufficiently suppressed, and heat resistance and whisker resistance are maintained at a high level, which is recommendable. Providing the metal layer 4 consisting of two or more layers would be more effective; however, from the viewpoint of cost effectiveness, it is appropriate to provide one layer as the metal layer 4.

Figure 5:
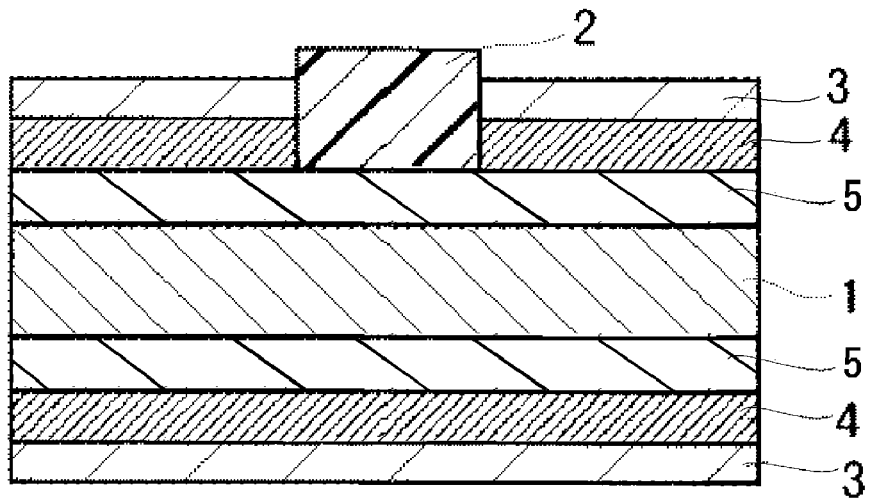
FIG. 5 is an enlarged cross-sectional view illustrating an exemplary composite material for an electric/electronic part according to a fifth embodiment of the present invention.

FIG. 5 is an enlarged cross sectional view of a composite material according to a fifth embodiment of the present invention.

The metal base 1 is subjected to a surface pre-treatment to provide organic or inorganic bonding, including a coupling treatment such as silane coupling treatment or titanate-based coupling treatment, and the resin film 2 is provided on the surface pre-treatment layer 5 at one site where insulation is required, while a underlying metal layer 4 and a Sn or Sn alloy plating layer 3 are provided in this order on the metal base 1 at the sites where the resin film 2 is not provided. In this composite material, the metal base 1 has been subjected to, for example, a silane coupling treatment, and the residual solvent quantity in the resin film 2 after the re-melting and solidification of the plating layer 3 is adjusted to 5% to 25% by mass. Therefore, the adhesion between the metal base 1 and the resin film 2 is further enhanced.

Embodiments of the composite material of the present invention are illustrated in FIG. 1 to FIG. 5. In these embodiments, the resin film 2 is provided on one of the surfaces of the metal base 1 at at least one site where insulation is required, and the resin film is not provided on the other surface of the metal base 1. However, the resin film 2 may be provided, if necessary, on at least a part of the other surface. Furthermore, in the embodiments shown in FIG. 1 to FIG. 5, a Sn or Sn alloy plating layer, and, optionally, an additional metal underlying layer, are provided over the entire surface of the other surface, but these layers may not be provided at all or may be provided on at least a part of the other surface.

At the site where the resin film 2 of the composite material of the present invention is not provided, a heat sink of copper or the like may further be provided in order to enhance heat dissipation capacity drastically. Particularly, in the composite materials illustrated in FIGS. 6 and 7, the heat sink can be bonded by soldering easily.

Figure 6:
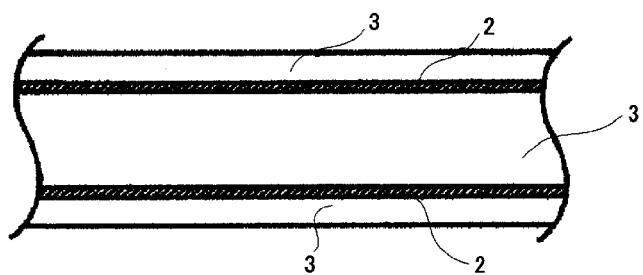
FIG. 6 is an enlarged plan view illustrating an exemplary composite material for an electric/electronic part according to a sixth embodiment of the present invention.

FIG. 6 is a plan view of a composite material according to a sixth embodiment of the present invention.

The resin film 2 is provided in stripes on sites of the metal base 1 where insulation is required. On the metal base at the sites other than the sites where the resin film 2 is provided, a reflow Sn or Sn alloy plating layer 3 may be provided or a underlying metal layer 4 and a reflow Sn or Sn alloy plating layer 3 may be provided in this order. Furthermore, it is also acceptable to provide the resin film 2 on the underlying metal layer 4 which is provided on the metal base 1, at those sites where insulation is required, and to provide a reflow Sn or Sn alloy plating layer 3 on the metal layer 4 at the sites where the resin film 2 is not provided.

Figure 7:
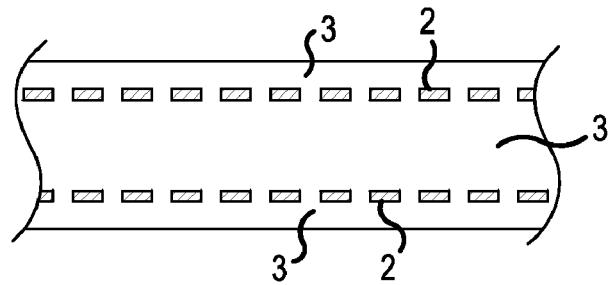
FIG. 7 is an enlarged plan view illustrating an exemplary composite material for an electric/electronic part according to a seventh embodiment of the present invention.
Figure 8:
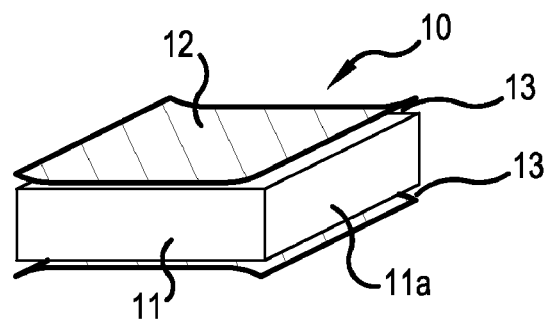
FIG. 8 is a conceptual view illustrating an example in which a gap is formed between a metal base and a resin film.
Figure 9:
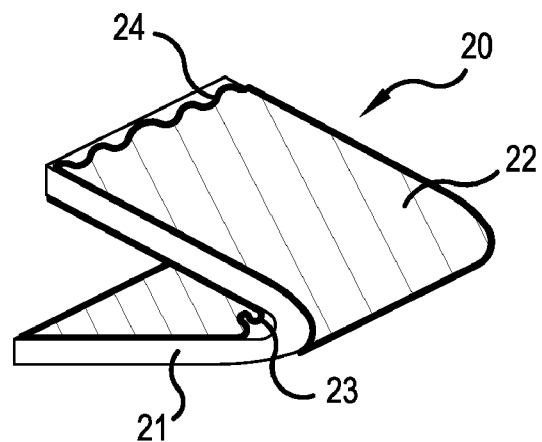
FIG. 9 is a conceptual view illustrating an example in which a gap is formed between a metal base and a resin film.

FIG. 7 is a plan view of a composite material according to a seventh embodiment of the present invention.

The resin film 2 is provided in spots on sites of the metal base 1 where insulation is required. The other structure is the same as that of the above-mentioned sixth embodiment.

The composite materials shown in FIG. 6 and FIG. 7 are such that the residual solvent quantity in the resin film 2 after the re-melting and solidification of the plating layer 3 is adjusted to 5% to 25% by mass. Therefore, the adhesion of the resin film 2 to the metal base 1, the effect of preventing the occurrence of whiskers in the plating layer 3, and the like are excellent.

EXAMPLES

The present invention will be described in more detail based on examples given below, but the invention is not meant to be limited by these.

Example 1

Strips of JIS alloy C5210R (phosphor bronze, manufactured by Furukawa Electric Co., Ltd.) having a thickness of 0.1 mm and a width of 20 mm were used as a metal base. The strips were subjected to electrolytic degreasing, acid pickling, water washing, and drying, in this order.

Then, a varnish (solid content: about 30%) containing a polyamide-imide (PAI) solution with N-methyl-2-pyrrolidone as a solvent was coated, on a center part in the width direction of the metal bases, at a coating thickness that would obtain a post-baking coating thickness of 10 μm (±1 μm), with a K-control coater (manufactured by RK Print Coat Instruments Ltd. UK), at a part of the metal bases, as illustrated in FIG. 1. Then, the predetermined heating treatment was performed, to dry the solvent and to cure, thereby to provide a resin film.

In Samples Nos. 101 to 905, the time for allowing the samples to stand in the furnace at a furnace temperature of 200° C. to 400° C. was varied, and the residual solvent quantity obtained after resin baking was varied to the amounts indicated in Table 1.

Strip materials were produced by electroplating a plating layer of Sn or a Sn alloy on the aforementioned strips at the surface where the resin film was not formed, using a commercially available or usual electroplating bath. Samples Nos. 101 to 104, Nos. 201 to 204, Nos. 301 to 304, Nos. 401 to 404, Nos. 501 to 504, Nos. 601 to 604, Nos. 701 to 704, Nos. 801 to 804, and Nos. 901 to 904 are samples having a Sn plating layer formed thereon. Samples No. 105, No. 205, No. 305, No. 405, No. 505, No. 605, No. 705, No. 805, and No. 905 are samples having a Sn alloy plating layer formed thereon. Here, the Sn alloy was a Sn—Zn alloy containing 10% by mass of Zn. Subsequently, the materials having the plating layer of Sn or Sn alloy formed thereon were heat treated to reflow, and thereby materials with a glossy plating layer of Sn or Sn alloy were obtained.

The reflow treatment of Samples No. 101 to 905 were carried out at a furnace temperature of 500° C., 700° C., or 900° C., respectively, as indicated in Table 1, for a time for allowing the samples to stand in the furnace adjusted as indicated in Table 1, and thereby the residual solvent quantity in the resin film was varied. In this manner, the samples of the composite materials for electric/electronic parts of the respective sample numbers were obtained.

The amount of the residual solvent (% by mass) was measured by gas chromatography under the following conditions.

Apparatus: HP5890+double shot pyrolyzer PY-2020D (manufactured by Frontier Laboratories Ltd.)

Column: SPB-20 (manufactured by Supelco) (30 m×0.25 mm ID×0.25 μm)

GC temperature: 50° C. (5 min)→10° C./min→280° C. (hold)

Insertion temperature: 280° C.

Insertion method: Split (30:1)

Detection method: FID

Det temperature: 280° C.

The samples were cut into 2 mm×10 mm and heated at 300° C. for 5 minutes, and the quantity of the generated gas was measured by gas chromatography (GC). The obtained results are shown in Table 1.

Furthermore, the peel strength was measured for the samples of the composite materials for electric/electronic parts of the respective sample numbers thus obtained.

The peel strength (kN/m) was measured with reference to IPC-TM-650 2.4.9. (Peel Strength, Flexible Printed Wiring Materials). Measurement was conducted by preparing a sample resin cut with a width of 3.2 mm and pulling the sample resin 228.6 mm at a rate of 50 mm/min. The obtained results are shown in the table 1. Practically, the peel strength is preferably 0.8 kN/m or more, and more preferably 1 kN/m or more.

As to the thus-obtained samples of the composite materials for electric/electronic parts of the respective samples numbers, punching workability and bending workability were evaluated as press workability. The obtained results are shown in Table 1.

The punching workability was evaluated by punching through the samples into a rectangular shape of 5 mm×10 mm by using a die with a clearance of 5%, then soaking the samples into an aqueous solution in which a red ink was dissolved, and observing the samples with a light microscope. Cases where the peel width of the film at the punched end of the material was less than 5 μm were denoted by "Excellent (⊙)", cases where the peel width was more than 5 μm and less than 10 μm are denoted by "Good (○)", and cases where the width was more than 10 μm are denoted by "Poor (×)".

The bending workability was evaluated as follows: the samples were punched though into a rectangular shape of 5 mm×10 mm by using a die with a clearance of 5%; subsequently the samples were bent by using a die having a curvature radius of 0.1 mm and a bending angle of 120 degrees devised to perform bending at the position 1 mm from the sample end; and then the samples were observed for peel-off of resin at the inside of the bent portion and for peel-off of resin at an end extended from the outside of the bent portion, with a light stereoscopic microscope (×40). At the same time, wrinkle, crack, and peel-off were observed in the resin film at the bended part. As to observation results, cases where no peel-off and no crack were observed are denoted by "Good (○)", and cases where wrinkle, crack, and peel-off were observed are denoted by "Poor (×)".

TABLE 1

| | Residual solvent quantity after resin baking (mass %) | Reflow treatment | | | Peel strength (kN/m) | Press workability | |
|---|---|---|---|---|---|---|---|
| | | Furnace temperature (° C.) | Time (sec) | Residual solvent quantity (mass %) | | Punching | Bending |
| 101 | 10.6 | 500 | 0.5 | 10.4 | 1.12 | ⊙ | ○ |
| 102 | 10.5 | 500 | 2.0 | 8.2 | 1.06 | ⊙ | ○ |
| 103 | 11.9 | 500 | 3.5 | 5.0 | 0.95 | ○ | ○ |
| 104* | 10.0 | 500 | 5.0 | 1.9 | 0.64 | × | ○ |
| 105 | 11.3 | 500 | 2.0 | 8.8 | 1.11 | ⊙ | ○ |
| 201 | 20.1 | 500 | 0.5 | 19.6 | 0.90 | ○ | ○ |
| 202 | 21.0 | 500 | 2.0 | 16.4 | 0.96 | ○ | ○ |

TABLE 1-continued

| | Residual solvent quantity after resin baking (mass %) | Reflow treatment | | Residual solvent quantity (mass %) | Peel strength (kN/m) | Press workability | |
|---|---|---|---|---|---|---|---|
| | | Furnace temperature (° C.) | Time (sec) | | | Punching | Bending |
| 203 | 20.5 | 500 | 3.5 | 8.5 | 1.14 | ⊙ | ○ |
| 204* | 20.4 | 500 | 5.0 | 3.8 | 0.69 | x | ○ |
| 205 | 20.4 | 500 | 2.0 | 15.7 | 0.98 | ○ | ○ |
| 301* | 30.2 | 500 | 0.5 | 29.5 | 0.61 | x | ○ |
| 302 | 29.8 | 500 | 2.0 | 23.3 | 0.85 | ○ | ○ |
| 303 | 31.5 | 500 | 3.5 | 13.1 | 1.01 | ⊙ | ○ |
| 304 | 30.1 | 500 | 5.0 | 5.6 | 1.07 | ⊙ | ○ |
| 305 | 30.5 | 500 | 2.0 | 23.8 | 0.83 | ○ | ○ |
| 401 | 11.3 | 700 | 0.5 | 10.9 | 1.13 | ⊙ | ○ |
| 402 | 10.7 | 700 | 2.0 | 5.6 | 1.08 | ⊙ | ○ |
| 403* | 11.6 | 700 | 3.5 | 1.7 | 0.58 | x | ○ |
| 404* | 10.1 | 700 | 5.0 | 0.5 | 0.23 | x | x |
| 405 | 12.4 | 700 | 3.0 | 6.5 | 1.11 | ⊙ | ○ |
| 501 | 20.0 | 700 | 0.5 | 19.3 | 0.88 | ○ | ○ |
| 502 | 19.7 | 700 | 2.0 | 10.3 | 1.11 | ⊙ | ○ |
| 503* | 20.4 | 700 | 3.5 | 2.9 | 0.58 | x | ○ |
| 504* | 20.4 | 700 | 5.0 | 0.9 | 0.31 | x | x |
| 505 | 22.3 | 700 | 2.0 | 11.7 | 1.08 | ⊙ | ○ |
| 601* | 28.7 | 700 | 0.5 | 27.7 | 0.57 | x | ○ |
| 602 | 29.1 | 700 | 2.0 | 14.9 | 1.01 | ⊙ | ○ |
| 603 | 31.2 | 700 | 3.5 | 5.0 | 0.94 | ○ | ○ |
| 604* | 30.6 | 700 | 5.0 | 1.4 | 0.54 | x | ○ |
| 605 | 30.3 | 700 | 2.0 | 15.9 | 0.95 | ○ | ○ |
| 701 | 9.8 | 900 | 0.5 | 9.3 | 1.10 | ⊙ | ○ |
| 702* | 10.9 | 900 | 2.0 | 2.8 | 0.69 | x | ○ |
| 703* | 10.0 | 900 | 3.5 | 0.5 | 0.23 | x | x |
| 704* | 11.2 | 900 | 5.0 | 0.2 | 0.08 | x | x |
| 705* | 10.1 | 900 | 2.0 | 2.9 | 0.69 | x | ○ |
| 801 | 20.5 | 900 | 0.5 | 19.4 | 0.98 | ○ | ○ |
| 802 | 20.0 | 900 | 2.0 | 5.8 | 1.09 | ⊙ | ○ |
| 803* | 21.3 | 900 | 3.5 | 1.1 | 0.49 | x | ○ |
| 804* | 19.4 | 900 | 5.0 | 0.3 | 0.09 | x | x |
| 805 | 20.4 | 900 | 2.0 | 5.9 | 1.11 | ⊙ | ○ |
| 901* | 28.1 | 900 | 0.5 | 26.6 | 0.68 | x | ○ |
| 902 | 27.5 | 900 | 2.0 | 8.0 | 1.10 | ⊙ | ○ |
| 903* | 29.8 | 900 | 3.5 | 1.5 | 0.51 | x | ○ |
| 904* | 31.4 | 900 | 5.0 | 0.4 | 0.12 | x | x |
| 905 | 32.0 | 900 | 2.0 | 9.2 | 1.13 | ⊙ | ○ |

*indicates comparative samples

As shown in Table 1, the samples according to the present invention had satisfactory peel strength and press workability, and particularly in the samples in which the residual solvent quantity after the reflow treatment was more than 5% by mass and equal to or less than 15% by mass, the peel strength and the press punchability were particularly satisfactory. On the other hand, the comparative samples were inferior in the peel strength and press workability. In the comparative samples in which the residual solvent quantity obtained after resin baking was more than 30% by mass, defects such as bubbles in some part of the resin film were recognized, irrespective of whether the press workability after the reflow treatment is good or bad.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-165138 filed in Japan on Jun. 24, 2008, which is entirely herein incorporated by reference.

The invention claimed is:

1. A composite material for an electric/electronic part, having a metal base, a resin film on at least a part of the metal base, and a layer of Sn or a Sn alloy on at least a part of the metal base at a site where the resin film is not provided, the layer of Sn or a Sn alloy including a solidified structure, and the resin film having a residual solvent quantity adjusted to 5% to 25% by mass.

2. The composite material for an electric/electronic part according to claim 1, wherein the resin film is composed of a polyamide-imide.

3. The composite material for an electric/electronic part according to claim 1, wherein the metal base is of copper or copper alloy.

4. The composite material for an electric/electronic part according to claim 1, wherein one or plural metal layers are provided on the metal base, and the resin film is provided on the metal base directly or with at least one of the metal layer interposed between the resin film and the metal base.

5. An electric/electronic part using the composite material for an electric/electronic part according to claim 1, having the residual solvent quantity in the resin film adjusted to 5% to 25% by mass.

6. The composite material for an electric/electronic part according to claim 1, wherein the composite material is suitable for press working; and wherein the resin film having the adjusted residual solvent quantity is placed at a position where the composite material where the resin film is to be press-worked.

7. The composite material for an electric/electronic part according to claim 6, wherein the press working is punching or bending.

8. A composite material for an electric/electronic part, having a metal base, a resin film on at least a part of the metal base, and a layer of Sn or a Sn alloy on at least a part of the metal base at a site where the resin, film is not provided, the layer of Sn or a Sn alloy including a solidified structure, and the layer of Sn or a Sn alloy being obtained by heating a layer formed by plating and thereby re-melting and solidifying the layer, wherein the resin film prior to the re-melting and solidifying of the plating layer has a residual solvent quantity adjusted to 10% to 30% by mass, and the resin film after the re-melting and solidifying of the plating layer has a residual solvent quantity adjusted to 5% to 25% by mass.

9. The composite material for an electric/electronic part according to claim 8, wherein the resin film is composed of a polyamide-imide.

10. A composite material for an electric/electronic part, having:
- a metal base, a resin film which is obtained by applying a varnish prepared by dissolving a resin or a resin precursor in a solvent, on at least a part of the metal base and reactively curing the resin film by a heating treatment, and
- a layer of Sn or a Sn alloy provided on at least a part of the metal base at a site where the resin film is not provided, the layer of Sn or a Sn alloy including a solidified structure, and
- wherein the composite material is for use that requires press working,
- wherein the layer of Sn or a Sn alloy is obtained by forming a layer by plating and then heating the layer thereby re-melting and solidifying the layer, the resin film after the re-melting and solidifying of the layer of Sn or a Sn alloy has the residual solvent quantity adjusted to 5% to 25% by mass, and thereby both the adhesion between the resin film and the metal base at the time of press working, and the press workability are excellent.

11. The composite material for an electric/electronic part according to claim 10, wherein the resin film is composed of a polyamide-imide.

12. A composite material for an electric/electronic part, having:
- a metal base, a resin film which is obtained by applying a varnish prepared by dissolving a resin or a resin precursor in a solvent, on at least a part of the metal base and reactively curing the resin film by a heating treatment, and
- a layer of Sn or a Sn alloy provided on at least a part of the metal base at a site where the resin film is not provided, the layer of Sn or a Sn alloy including a solidified structure, and
- wherein the composite material is for use that requires press working,
- wherein the layer of Sn or a Sn alloy is obtained by forming a layer by plating and heating the layer thereby re-melting and solidifying the layer, the resin film prior to the re-melting and solidifying of the layer of Sn or a Sn alloy has the residual solvent quantity adjusted to 10% to 30% by mass, the resin film after the re-melting and solidifying of the layer of Sn or a Sn alloy has the residual solvent quantity adjusted to 5% to 25% by mass, and thereby both the adhesion between the resin film and the metal base at the time of press working, and the press workability are excellent.

13. The composite material for an electric/electronic part according to claim 12, wherein the resin film is composed of a polyamide-imide.

14. A method for producing a composite material for an electric/electronic part, comprising:
- forming, on at least a part of a metal base, a resin film having a residual solvent quantity of 10% to 30% by mass;
- forming a plating layer of Sn or a Sn alloy, on at least a part of the metal base, at a site where the resin film is not provided;
- heating the plating layer after the forming of the plating layer, thereby re-melting and solidifying the plating layer to obtain a layer including a solidified structure, and, at the same time, adjusting the residual solvent quantity in the resin film obtained after re-melting and solidifying the plating layer, to a value lower than the residual solvent quantity at the time of the formation of the resin film and 5% to 25% by mass.

15. The method for producing a composite material for an electric/electronic part according to claim 14, wherein the resin film is composed of a polyamide-imide.

* * * * *